United States Patent [19]

Szluk et al.

[11] Patent Number: 4,647,340
[45] Date of Patent: Mar. 3, 1987

[54] PROGRAMMABLE READ ONLY MEMORY USING A TUNGSTEN FUSE

[75] Inventors: Nicholas J. Szluk; Werner A. Metz, Jr.; Gayle W. Miller; Maurice M. Moll, all of Fort Collins, Colo.

[73] Assignee: NCR Corporation, Dayton, Ohio

[21] Appl. No.: 846,395

[22] Filed: Mar. 31, 1986

[51] Int. Cl.$^4$ .................. H01L 21/306; H01L 21/00; H01L 21/22

[52] U.S. Cl. .................... 156/662; 156/643; 156/653; 156/657; 156/659.1; 29/571; 29/591; 148/1.5; 148/187

[58] Field of Search .......... 156/643, 653, 657, 659.1, 156/662; 29/591, 571; 148/1.5, 187

[56] References Cited

U.S. PATENT DOCUMENTS 4,466,172  8/1984  Batra .............................. 156/653 X
4,517,225  5/1985  Broadbent ...................... 156/662 X

FOREIGN PATENT DOCUMENTS 0054259  6/1982  European Pat. Off. ............ 156/662

Primary Examiner—S. Leon Bashore
Assistant Examiner—Thi Dang
Attorney, Agent, or Firm—Wilbert Hawk, Jr.; Casimer K. Salys

[57] ABSTRACT

An electrically programmable memory cell using selectively deposited tungsten on a sidewall to define a fuse region. Fabrication of the fuse structure involves only a single mask departure from standard MOSFET processing during which a selective isotropic etch of a silicon nitride sidewall structure facilitates the formation of a fuse structure comprised of a tungsten layer selectively deposited on exposed silicon and a source/drain diffusion separated by an oxide or selectively thinned oxide as the degenerating element. The actuation region of the fuse is proportional to the thickness of the selectively deposited tungsten layer.

7 Claims, 9 Drawing Figures

PROGRAMMABLE READ ONLY MEMORY USING A TUNGSTEN FUSE

BACKGROUND OF THE INVENTION

The present invention relates to programmable memories, to programmable read-only memories (PROMs) and, in particular, to a fuse programmable ROM which uses oxide breakdown between narrow selectively formed sidewall conductor structures and diffusion regions. The invention also relates to a method for making a fuse programmable ROM in which a tungsten fuse is deposited as part of a contemporary tungsten-polysilicon shunt deposition procedure during otherwise conventional fabrication of field effect type integrated circuits.

Programmable ROMs are known in which the cells of a ROM memory array contain fusible links. Various fusible link ROM designs are available in which the manufacturer or customer applies high currents to selected bit locations to blow the fusible links so that the associated transistor is open and does not conduct current. The ROM is thus permanently programmed to a selected 1/0 pattern of conducting and non-conducting bits.

Conversely, the fusible link technology has also been used to break down an insulator to thus complete a conduction path for active and passive devices. For example, U.S. Pat. No. 3,576,549, issued Apr. 27, 1971, to Hess, forms a contact on an insulating layer over a semiconductor substrate. The substrate contains a device such as a diode or bipolar transistor. The device is programmed by applying to the conductor a voltage of sufficient magnitude and duration to break down the insulator between the contact and the device so that the conductor makes ohmic contact with the device. U.S. Pat. No. 3,787,822, issued Jan. 22, 1974, to Rioult, discloses a programmable read-only memory which uses a somewhat similar approach. Basically, the approach involves completing a conduction path from a contact to an underlying metallic conductor which itself contacts the emitter of a bipolar transistor formed in a semiconductor substrate. Like the Hess patent, Rioult establishes ohmic contact by applying a voltage to break down an oxide layer which, in this case, is interposed between the contact and the metal conductor.

Another vertical fuse technique is described in U.S. Pat. No. 4,312,046, issued Jan. 19, 1982, to Taylor. Here, programmable read-only memories are provided by an array of bipolar devices formed in a substrate having surface-adjacent emitters beneath an aluminum conductor. The device emitters each form a programmable Schottky diode with the aluminum contact material. The diode is vertically shorted by applying a voltage across the diode to cause vertical electromigration of aluminum atoms to short the conductor directly to the emitter.

More recent approaches to breaking down or otherwise degrading dielectric layers to selectively form conductive paths in the course of programming are disclosed in U.S. Pat. No. 4,543,594 granted to inventors Mohsen et al. and U.S. Pat. Nos. 4,507,756 and 4,507,757 to inventor McElroy. The first of the noted patents relates to use of direct silicon dioxide breakdown, while the latter two extend the breakdown concepts by utilizing excentuated fringing fields to degrade a silicon dioxide layer in the course of forming conductive paths therethrough. These techniques unfortunately require special breakdown dielectric fabrication sequences, distinct from the steps commonly employed to fabricate field effect transistors, and, by virtue of the relatively large area subject to alteration during programming, require the inclusion of programming current limiting circuitry.

In view of the unique fabrication requirements imposed by the prior art approaches, it is one object of the present invention to provide a simple vertical fuse technique for programmable read-only memories which is implemented by, and is formed without departing from, the contemporary circuit fabrication process.

It is also an object of this invention to provide such a vertical fuse PROM technique which is applicable to low current integrated circuit technologies, featuring a structurally created programming current limitation.

It is also an object to integrate the vertical fuse element with a polysilicon conductor-to-diffusion structure by using a basic integrated circuit processing, using only a single additional masking step.

SUMMARY OF THE INVENTION

In one aspect, the present invention relates to a process for forming an integrated circuit comprising at least one MOSFET formed on a semiconductor substrate having a tungsten shunted polysilicon gate electrode structure. The basic field effect transistor fabrication process is modified to form an electrically programmable, vertical sidewall tungsten-programming oxide-diffusion fuse structure which is programmable by applying a voltage between the tungsten and the diffused region of adequate magnitude and duration to short the tungsten to the diffusion. The modified process comprises: (1) as part of the step of forming the MOSFET source and drain, forming the diffusion of the vertical fuse structure; (2) as part of the step of forming the MOSFET structure forming an oxide layer over the fuse diffusion; (3) as part of the step of forming the polysilicon component of the tungsten-polysilicon gate electrode structure, forming the polysilicon component of the fuse structure adjacent or overlapping the fuse diffusion; (4) forming a conformed layer of silicon nitride over the resulting integrated structure; (5) anisotropically etching the silicon nitride to selectively remove the nitride, leaving nitride on the sidewalls of the polysilicon conductor of the shunt structure and the polysilicon conductor of the fuse structure; (6) forming a mask on the resulting structure having a window exposing the sidewall nitride on the polysilicon of the fuse structure; (7) etching the silicon nitride in the presence of the mask to remove the silicon nitride from the polysilicon sidewalls of the fuse structure; (8) selectively thinning the oxide layer over the fuse diffusion in a region adjacent the polysilicon sidewalls of the fuse structure to define a program oxide region; and (9) as part of the step of forming the tungsten shunt layer of the composite tungsten-polysilicon gate electrode structure, selectively depositing a layer of tungsten over the polysilicon fuse structure sidewall to contact the program oxide region overlying the diffusion, during which step the gate sidewall nitride prevents tungsten formation thereon.

In another aspect, the fuse polysilicon is electrically connected to the gate of a memory cell transistor and the fuse diffusion is electrically connected to the source/drain of the memory transistor so that blowing the fuse alters the logic state of the cell.

DETAILED DESCRIPTION OF THE INVENTION

Figure 1:
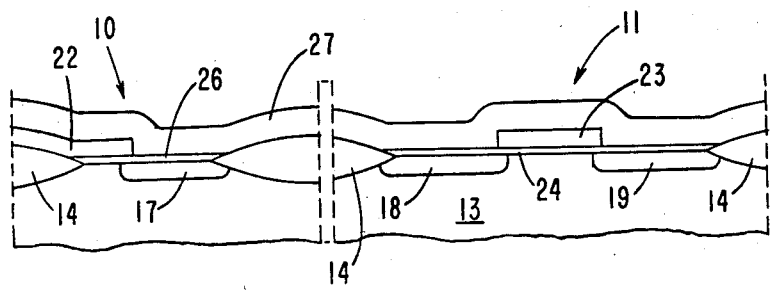
FIGS. 1 through 5 are cross-sectional representations of a MOSFET integrated circuit sequentially illustrating the process of forming the sidewall tungsten fuse structure of the present invention.

FIGS. 1 through 5 are cross-sectional representations of the fabrication of an integrated circuit, taken sequentially during the process of forming the tungsten sidewall fuse structure of the present invention. (The proportions used in the drawings are selected for clarity and are not to scale.) This fuse structure is formed simultaneously with and is integrated with the process of forming peripheral circuit field effect transistors having tungsten shunted polysilicon gate electrode structures.

Figure 5:
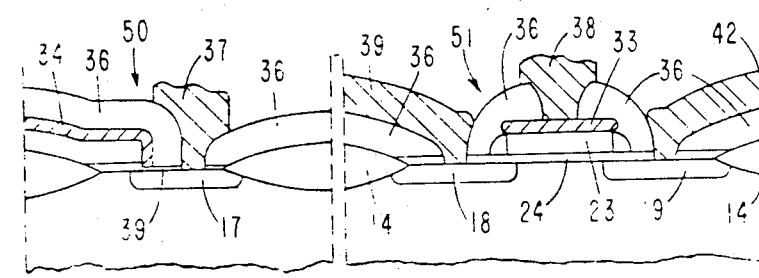
Figure 6:
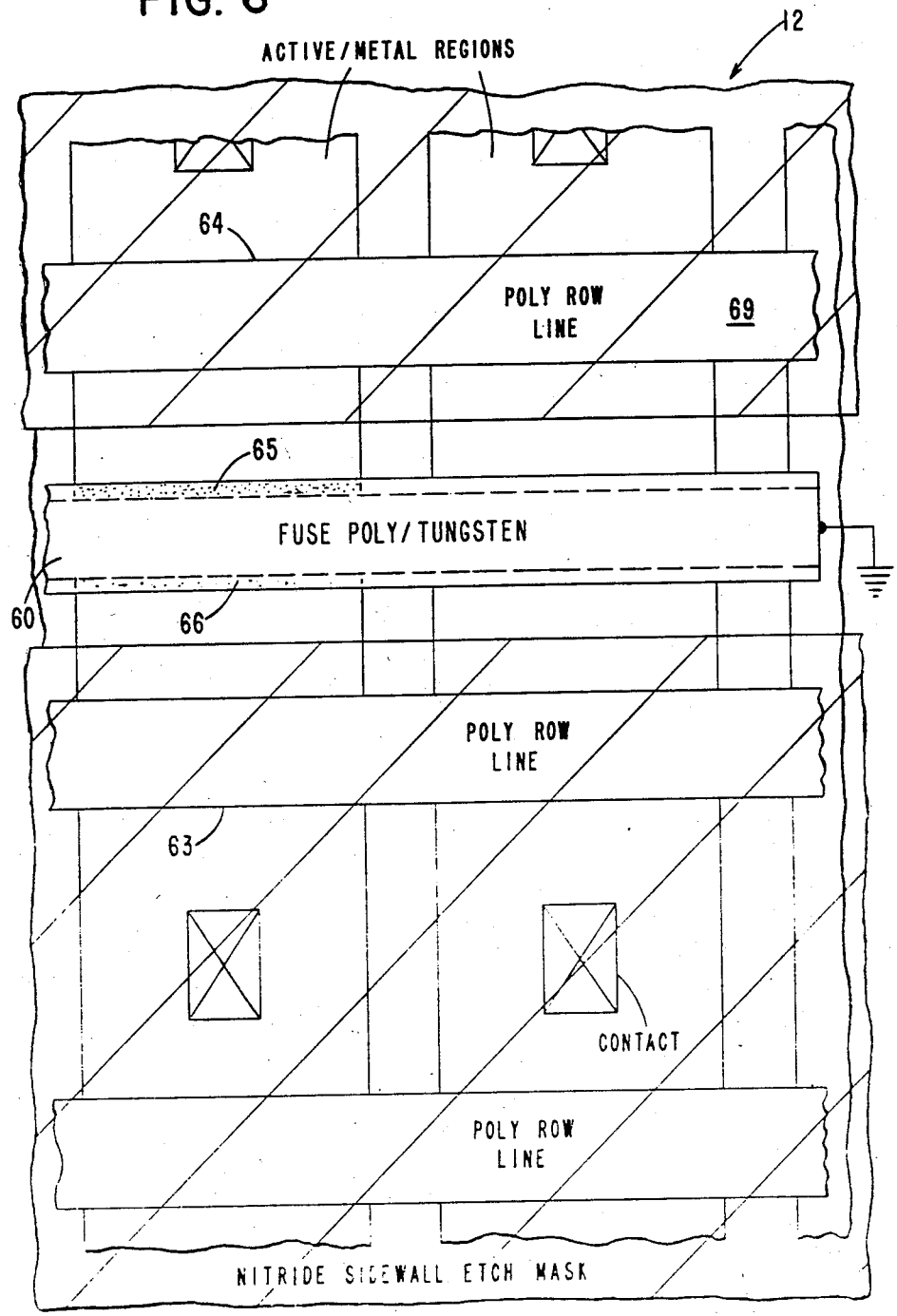
FIG. 6 is a layout of the tungsten sidewall fuse structure in a memory array.
Figure 7:
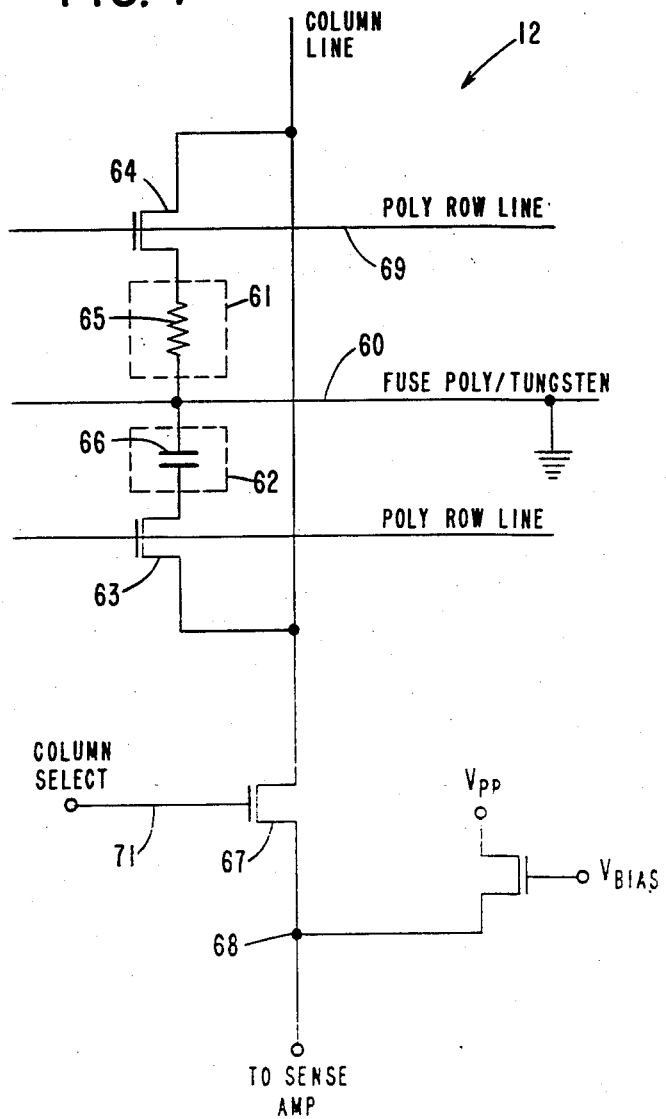
FIG. 7 is a simplified schematic of a programmable memory organization which utilizes the tungsten sidewall fuse structure of the present invention.

A representative tungsten sidewall fuse structure 50 and the peripheral transistor structure 51 appear in FIG. 5. FIG. 6 is a layout for and FIG. 7 is a circuit schematic of a programmable read-only memory array 12 which uses the sidewall fuse structure of the present invention. In this configuration, the fuse polysilicon/tungsten line 60 is shared by fuse cells 61 and 62 of array 12, which cells are individually addressable via FETs 63 and 64 to form between fuse polysilicon/tungsten 60 and the respective source/drain electrodes a conductive element 65 or a dielectrically coupled capacitive element 66. The former, resistive element 65, represents a "blown" fuse while the latter, capacitive element 66, represents an intact, "unblown" fuse structure exhibiting MIS characteristics.

Referring now to the fabrication process as first depicted in FIG. 1, that figure shows an NMOS or PMOS integrated circuit structure at an intermediate step during a standard integrated circuit processing sequence, which is the beginning of the processing sequence of the present invention. The intermediate form structure 10 evolves into the tungsten sidewall fuse structure 50 in FIG. 5. Initially fuse diffusion 17 is formed into substrate 13 within the region between field oxides 14. Similarly, structure 11 corresponds to the shunted polysilicon gate transistor having the concluding structure 51 as appears in FIG. 5, comprised of source 18, drain 19, gate oxide 24 and polysilicon gate electrode 23, all formed in an active region bounded by field oxides 14. Note that at the stage of fabrication depicted in FIG. 1 structure 10 includes a polysilicon electrode layer 22, a gate type oxide layer 26, and diffused region 17 preferably self-aligned with polysilicon electrode layer 22. Oxide layer 26 can be formed as part of the same oxidation which forms the typically 37.5 nanometer thick peripheral transistor 11 gate oxide 24 and can be subsequently thinned to form a program oxide, or can in the alternative be selectively formed to a 10-20 nanometer thickness. Preferably, however, polysilicon conductor layer 22, oxide 26 and diffusion 17 of fuse structure 10 are formed by the same process sequence which is used to form the poly gate electrode 23, gate oxide 24 and source/drain regions 18/19 of transistor structure 11.

Thereafter, a conformal layer of silicon nitride 27 is deposited using conventional techniques. Preferably, the layer is about 500 nanometers thick. This completes the structures 10 and 11 as shown in FIG. 1. At this point, the conventional MNOS or PMOS process has been used to form the diffusion 17, oxide 26, and polysilicon layer 22, and has been modified by the formation of the silicon nitride layer 27.

Figure 2:
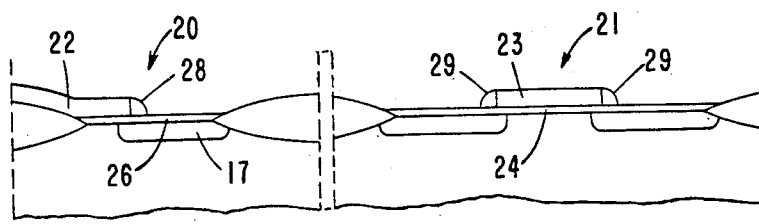

Referring to FIG. 2, an anisotropic etch process such as ion-assisted reactive ion etching is used to remove the nitride 27 everywhere except for the sidewall masking sections 29—29 which are left at the sides of the gate electrode 23, and the section 28 on the sidewall of the polysilicon electrode 22. One suitable anisotropic dry etch process is reactive ion etching using a $SF_6+O_2$ etching gas. In reactive ion etching, the mechanical component or ion bombardment component dominates the chemical reaction component and provides the very well defined vertical etch characteristics which are responsible for removing the nitride everywhere except at the vertical sidewalls. It is important to note that oxide layers 24 and 26, as well as polysilicon layers 22 and 23 are not materially removed by this nitride selective etch. This selectivity ensures the retention of an oxide layer over diffusion 17.

Figure 3:
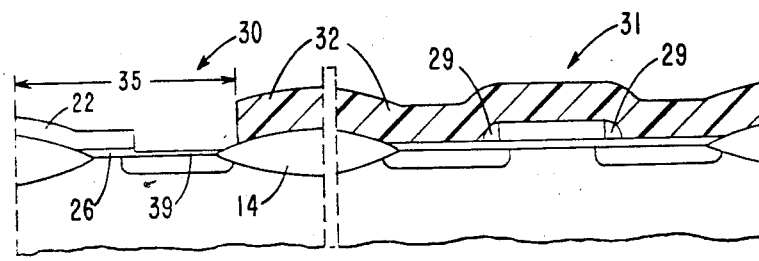

Next, an etching mask is formed on the structures 20 and 21 of FIG. 2. Referring to FIG. 3, the mask 32 is preferably a photoresist deposited and delineated using conventional photolithographic techniques. The resulting etching mask 32 is created to have a window 35 which exposes the polysilicon electrode 22 and sidewall nitride 28 while covering FET structure 21. Note that mask 32 exposes the fuse cell regions, as further depicted in FIGS. 6 and 7, of any composite FET/fuse array.

The exposed sidewall nitride is then removed preferably using an isotropic etch, for example, hot phosphoric acid, while photoresist mask 32 ensures the retention of sidewall nitride 29—29 for the FETs 31. The goal of this etch, whether it be wet or dry, is to remove the sidewall nitride 28 while retaining an acceptable thickness of programming oxide 39 at the time of selective tungsten deposition. Preferably, the thickness of oxide layer 26 is next, or possibly in concurrence with the isotropic nitride etch, reduced to form a programming oxide layer 39 overlying diffusion 17 between polysilicon electrode 22 and field oxide 14 to a thickness of about 10-20 nanometers by, for example, using hydrofluoric acid etchant and the mask 32 a second time. The resulting intermediate sidewall fuse structure 30 shown in FIG. 3 has the programming oxide 39 tailored to the desired thickness and has the sidewall of polysilicon conductor 22 devoid of nitride. However, the intermediate form FET structure 31 retains the nitride sidewall mask 29—29.

Figure 4:
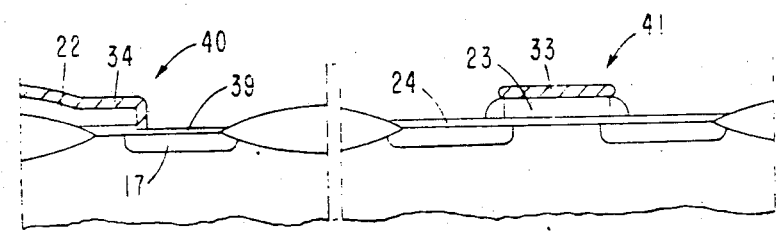

Referring now to FIG. 4, next, the mask 32 is removed and tungsten layers 33 and 34 are simultaneously and selectively deposited on any exposed silicon, here on the polysilicon conductors 22 and 23, respectively.

Preferably, the tungsten is selectively deposited to a thickness of about 80 to 120 nanometers using a $WF_6+H_2$ process. This process deposits the tungsten over all the exposed areas of the polysilicon electrodes 22 and 23, that is, on the top and sidewalls of electrode 22, but only on the top of the nitride sidewall masked transistor structure 41. That is, the tungsten layer 33 is deposited only on the top surface of the polysilicon gate electrode 23, due to the masking sidewall nitride 29—29 of transistor structure 41. However, tungsten layer 34 is deposited both on the top and sidewall of conductor 22, to thus form the tungsten-34—program oxide-39—diffusion-17 fuse structure 40.

During the selective deposition step, no tungsten is formed over the oxide regions such as the field oxide 14 gate oxide 24 or the program oxide 26, to the extent not initiated by the growth progressing from polysilicon layer 22. The tungsten conducting members 33 and 34 formed in this manner grow radially from and retain excellent adhesion to the underlying polysilicon conductors, such as 22 and 23. As the tungsten deposits selectively and radially from the polysilicon, the tungsten layer forms an automatically patterned, low resistance shunt layer 33 over the polysilicon gate 23 and other polysilicon conductors/interconnects (not shown) as well as the tungsten 34-program oxide 26-diffusion 17 fuse structure.

Note that in the context of the fuse structure 40 in FIG. 4 the region in which the "fuse" action occurs, namely the breakdown of oxide layer 39 and the formation of conductive regions therethrough, is substantially defined by the thickness to which tungsten layer 34 is deposited. As such, not only is the region of the reaction highly localized to accentuate and accelerate the conversion from dielectric to conductor, but the dimensional constraints on the conductive path from polysilicon 22 to diffusion 17 tends to self-limit the programming currents. For the particular example defined above, conduction during programming is focused through a 0.08 to 0.12 micrometer wide (for tungsten 0.08 to 0.12 micrometers thick) stripe of electric field degraded silicon dioxide which is 0.1 to 0.2 micrometers thick.

As shown in FIG. 5, the structures 40 and 41 of FIG. 4 may then be completed using conventional chemical vapor deposition and metallization techniques to form the interlevel oxide layer 36 and aluminum conductors 37, 38, 39 and 42.

FIG. 7 depicts a representative circuit arrangement for a programmable read-only memory array 12 that incorporates the tungsten sidewall fuse structure 50 (tungsten 34-program oxide 39-diffusion 17) depicted in FIG. 5 in its individual memory cells 61 and 62. A layout for such an array is shown in FIG. 6.

The cells 61 and 62 are addressed by a specific combination of row and column line FETs. For example, cell 61 is addressed by enabling row line FET 64 and column line FET 67 to provide cell state information via line 68 to a conventional sense amplifier. Cell 62 is similarly addressed using FETs 63 and 67.

Consider now the programming of a memory cell 61 (FIG. 7) using the tungsten sidewall fuse structure 50 (FIG. 5). In this configuration, unprogrammed (open) cells are arbitrarily defined to be logic 1 whereas programmed (shorted) cells are defined as logic 0. To program a cell, the row select decoder selects the specified row and turns on transistor 64 by raising voltage on the row line 69 to $V_{DD}$. Also, the column select decoder turns on transistor 67 for the selected column. The $V_{BIAS}$ is applied to transistor 71 while the programming voltage (typically −20 volts) is applied to $V_{PP}$. $V_{PP}$ and the thickness of programming oxide are selected so that application of $V_{PP}$ degrades the programming oxide in the fuse structure to establish an ohmic contact between the tungsten and the underlying diffusion. In the context of FIG. 7, the ohmic contact is represented by resistor 65 in cell 61, while the absence of such contact is represented by capacitor structure 66 in cell 62. One of skill in the art will also appreciate that capacitor 66 will exhibit characteristics of a MIS diode.

To read the state of cell 61, the unique row and column select lines 69 and 71 are energized. If the cell is programmed, the potential on the column line 68 will be subject to the current drawn through resistive element 65. The same is true whether column line is statically biased or merely precharged using the column line 68 distributed capacitance. In contrast, if cell 62 were address the potential on column line 68 remain substantially intact. The voltage on line 68 is then read by a conventional sense amplifier to develop binary logic 0 and 1, for respective cells 61 and 62.

Figure 8:
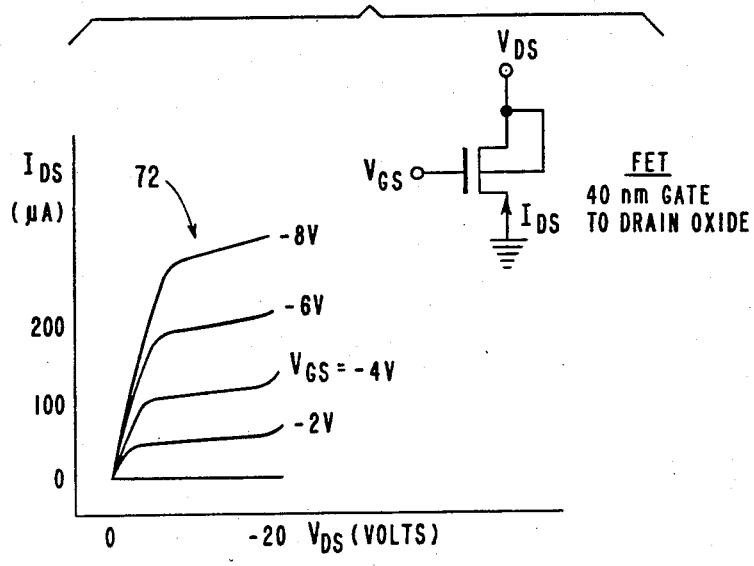
FIGS. 8 and 9 are plots of current versus voltage for a p-channel transistor structure employing a tungsten sidewall fuse of the present invention, taken before and after programming, respectively.

Field effect transistors with polysilicon gate electrodes and selectively formed sidewall tungsten-to-source/drain silicon fuse structures have been built and tested by programming on selected sides of a gate electrode structure. FIG. 8 shows a representative set of $I_{DS}$ versus $V_{DS}$ curves 72 for an unprogrammed p-channel MOSFET incorporating a tungsten gate electrode shunt structure, such as 51 in FIG. 5, yet modified during fabrication to omit the sidewall masking nitride regions. The gate oxide 24, and consequently the structure programming oxide, was about 40 nanometers in thickness.

Figure 9:
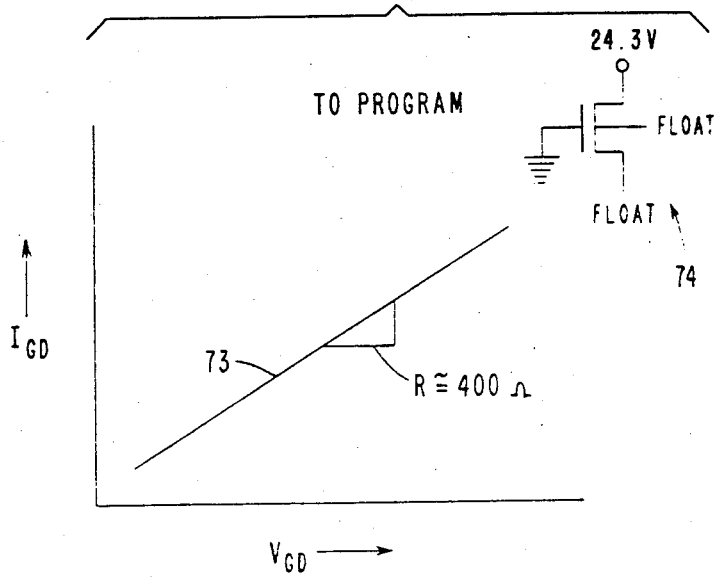

Plot 73, FIG. 9, illustrates the $I_{GD}$ (gate-to-drain) versus $V_{GD}$ behavior after the same MOSFET was programmed using the circuit configuration 74. In effect, programming degenerated the oxide between the polysilicon gate sidewall tungsten and drain diffusion to create a permanent conductive path having a nominal resistance of 400 ohms.

Similar results were obtained for gate-to-source sidewall tungsten fuse structures.

Thus, there has been described a novel sidewall tungsten-to-diffusion overlap fuse structure that is implemented using only one additional masking step; relies on the selective tungsten deposition which is already used for shunting polysilicon structures used in interconnects and in peripheral circuitry; uses a simple programming technique and a low programming voltage; allows for the selective thickness adjustment of the dielectric subject to programming by degeneration; provides for the formation of a programming electric field in concentrated and dimensionally constrained regions to control programming current and time characteristics; provides fast operating speeds due to the tungsten; and can be implemented as a very dense structure. Having described preferred and alternative embodiments of our invention, those of average skill in the are will readily use the disclosure provided here to alter the processing sequence and structure within the scope of the present disclosure and the scope of the following claims.

We claim

1. In the process for forming an integrated circuit comprising at least one MOSFET transistor formed on a semiconductor substrate having a tungsten shunted polysilicon gate electrode structure, the process of forming an electrically programmable, vertical sidewall tungsten-programming oxide-diffusion fuse structure, programmable by the application of a voltage between the tungsten and the diffusion to form a permanent conductive path between the tungsten and the diffusion, comprising:

as a part of the step of forming the MOSFET gate oxide, polysilicon gate electrode and the source/drain regions, forming a fuse diffusion of the vertical fuse structure covered by an oxide layer and a polysilicon component of the fuse structure overlying the oxide layer adjacent the fuse diffusion;

forming a layer of conformed silicon nitride over the resulting integrated circuit structure;

anisotropically etching the silicon nitride to selectively remove the nitride, leaving nitride only on the sidewalls of the polysilicon conductor of the gate electrode structure and the polysilicon conductor of the fuse structure;

forming a mask on the resulting structure having a window exposing the sidewall nitride on the polysilicon of the fuse structure; etching the silicon nitride in the presence of the mask to remove the silicon nitride from the polysilicon sidewalls of the fuse structure; and as part of the step of forming the tungsten shunt layer of the composite tungsten shunted polysilicon gate electrode structure, selectively depositing a layer of tungsten over the polysilicon component of the fuse structure, including the sidewalls thereof, contacting the oxide layer overlying the diffusion, and so that tungsten is not formed onto oxide or the gate sidewall nitride.

2. The process of claim 1 further comprising the step, after the nitride is removed from the sidewall of the polysilicon component of the fuse structure and prior to the selective deposition of tungsten step, of etching the oxide layer overlying the diffusion adjacent the fuse structure to a predetermined thickness.

3. The process of claim 1 wherein the anisotropic etch of the silicon nitride is selective so as not to remove material amounts of exposed polysilicon or oxide.

4. The process of claim 1 wherein the silicon nitride is removed from the polysilicon sidewalls of the fuse structure using a isotropic etch suitable to thin the oxide layer overlying the diffusion adjacent the fuse structure.

5. The process of claim 1 wherein the final oxide thickness between the tungsten and diffusion is about 10–20 nanometers and is thereby degradable by a program voltage of about 10–20 volts.

6. In a process for forming MOSFET devices comprising tungsten shunted polysilicon gate electrode structures, the process for forming fuse structures of tungsten-programming oxide-substrate diffusion along a stripe having a width proportional to the thickness of the tungsten comprising:

forming the gate oxide, the polysilicon component of the gate electrode and the source/drain diffusion of the MOSFET and simultaneously forming the oxide, the polysilicon component and the substrate diffusion of the fuse structure, and wherein the polysilicon component of the fuse structure is adjacent to two separate diffusions electrically interconnected to the source/drain regions of two separate MOSFET devices;

forming a conformal layer of silicon nitride over the resulting integrated circuit structure;

anisotrcpically etching the silicon nitride to selectively remove the nitride, leaving nitride only on the sidewalls of the polysilicon conductors of the gate electrode structure and the polysilicon conductor of the fuse structure;

forming a mask on the resulting structure having a window exposing the sidewalls of the polysilicon of the fuse structure;

etching the silicon nitride in the presence of the mask to remove the silicon nitride from the polysilicon sidewalls of the fuse structure; and as part of the step of forming the tungsten layer of the gate electrode structure, selectively forming a layer of tungsten over the polysilicon component of the fuse structure and on the sidewalls thereof contacting the oxide overlying the two separate diffusions.

7. The process of claim 6 further comprising the step, after the nitride is removed from the sidewalls of the polysilicon component of the fuse structure and prior to the selective formation of tungsten step, of etching the oxide layer overlying the diffusion adjacent the fuse structure to a predetermined thickness.

* * * * *